(12) United States Patent
Dobisz et al.

(10) Patent No.: US 6,773,865 B2
(45) Date of Patent: Aug. 10, 2004

(54) ANTI-CHARGING LAYER FOR BEAM LITHOGRAPHY AND MASK FABRICATION

(75) Inventors: Elizabeth Dobisz, San Jose, CA (US); Walter J. Dressick, Ft. Washington, PA (US); Susan L. Brandow, Springdale, MD (US); Mu-San Chen, Ellicott City, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 97 days.

(21) Appl. No.: 10/414,572

(22) Filed: Apr. 15, 2003

(65) Prior Publication Data

US 2003/0203311 A1 Oct. 30, 2003

Related U.S. Application Data

(62) Division of application No. 09/864,384, filed on May 25, 2001, now Pat. No. 6,586,158.

(51) Int. Cl.$^7$ ............................................. G03F 7/00
(52) U.S. Cl. ...................... 430/296; 430/322; 430/324; 430/325; 430/326
(58) Field of Search .................. 430/296, 942, 430/311, 322, 324, 325

(56) References Cited

U.S. PATENT DOCUMENTS

| | | | |
|---|---|---|---|
| 4,456,677 A | 6/1984 | Chin | 430/276.1 |
| 4,612,275 A | 9/1986 | Gregor | 430/296 |
| 4,702,993 A | 10/1987 | White et al. | 430/296 |
| 4,936,951 A | 6/1990 | Hashimoto et al. | 216/47 |
| 4,968,583 A | 11/1990 | Ohshio et al. | 430/296 |
| 5,019,485 A | 5/1991 | Nakamura et al. | 430/296 |
| 5,139,922 A | 8/1992 | Watanabe et al. | 430/296 |
| 5,169,494 A | 12/1992 | Hashimoto et al. | 438/703 |
| 5,288,368 A | 2/1994 | DeMarco et al. | 216/66 |
| 5,510,216 A * | 4/1996 | Calabrese et al. | 430/11 |
| 5,885,753 A * | 3/1999 | Crooks et al. | 430/324 |
| 6,015,509 A | 1/2000 | Angelopoulos et al. | 252/500 |
| 6,114,093 A | 9/2000 | Yamada | 430/296 |
| 6,114,099 A * | 9/2000 | Liu et al. | 430/324 |
| 6,132,644 A | 10/2000 | Angelopoulos et al. | 252/500 |

OTHER PUBLICATIONS

J Calvert J. Vac Su & Tech B V9 (1999) p 3447–3450.*
J.Calvert et al.:"Deep Ultraviolet Patterning of Monolayer Films for High Resolution Lithography";Jl.vac.Sc.Tech, B, v9,(1991), p.3447–3450.*
J. Calvert et al.; "Deep Ultraviolet Patterning of Monolayer Films for High Resolution Lithography", J. Vac. Sci & Tech. B. V. 9, (1991), pp. 3447–3450.
Lawliss, Angelopoulos, and Puisto, "Conductive Polyaniline: Applications in X–ray Mask Making", Journal of Vacuum Science & Technology B 15(6), 2224 (1997).

* cited by examiner

Primary Examiner—Mark F. Huff
Assistant Examiner—Kripa Sagar
(74) Attorney, Agent, or Firm—John J. Karasek; Stephen T. Hunnius

(57) ABSTRACT

This invention discloses an anti-charging layer for beam lithography and mask fabrication. This invention reduces beam displacement and increases pattern placement accuracy. The process will be used in the beam fabrication of high-resolution lithographic masks as well as beam direct write lithography of electronic devices. The anti-charging layer is formed by the use of metal films bound to metal ligating self-assembled monolayers (SAMs) as discharge layers.

40 Claims, 15 Drawing Sheets

ND-CHARGING LAYER FOR BEAM
LITHOGRAPHY AND MASK FABRICATION

This is a divisional application of copending U.S. patent application Ser. No. 09/864,384 now U.S. Pat. No. 6,586,158 inventor Dobisz et al., filed May 25, 2001, the entirety of which is herein incorporated by reference.

BACKGROUND OF THE INVENTION

1. Field of the Invention

The present invention relates to beam lithography. More specifically, the present invention relates to procedures and materials for the reduction of charging during e-beam, ion beam, and X-ray lithography.

2. Description of the Related Art

Electron-beam lithography is a process whereby a pattern is written or printed into an imaging layer on a substrate using an electron exposure source. The substrate may be a surface on which a device or material will be directly patterned or it may be a surface which will eventually be used as a mask or mold in a subsequent patterning procedure. The susceptibility of the imaging layer to electron irradiation allows the chemistry and/or surface energy of the layer to be modified upon electron exposure. Selective exposure of the imaging layer by scanning the e-beam can be used to create a patterned chemical template on the surface. Typically the imaging layer is a polymer, known as a resist, whose chemistry is altered by electron exposure. The chemical change leads to a change in solubility of the polymer in a particular solution, known as the developer. This allows for selective removal of the irradiated (or unirradiated) regions of the layer. The pattern may be transferred into the underlying substrate by a variety of processes such as, but not limited to, selective etching or materials deposition on or in the imaging layer pattern. This process is routinely used to fabricate electronic devices and lithographic masks. Other U.S. applications include, for example, the fabrication of encryption messages on surfaces. The treasury department has investigated the possibility of writing e-beam patterns on currency to reduce the ease of counterfeiting. It is intended that the invention cover these novel applications as well as the more common applications in mask making, semiconductor device manufacture, electro-optic device manufacturing, micro-electromechanical (MEMs) device manufacturing, system on a chip (SOC), and data storage.

In e-beam lithography, charging of the substrate-resist system can occur. The resulting electric field can deflect the e-beam causing pattern placement and critical dimension (CD) error. The international Semiconductor Industry Association (SIA) has constructed a roadmap for projected specifications for semiconductor devices, mandated by economic drivers. By the end of the next decade a pattern placement accuracy of <20 nm and a CD tolerance of <5 nm will be required. Other industries, such as data storage, are on similar roadmaps. Consequently, pattern placement errors due to charging in e-beam lithography are becoming an increasingly important problem.

Charging, in e-beam lithography, originates when the number of electrons entering a region of a material does not equal the number of electrons exiting that region of material. Conditions encountered in e-beam lithography typically fall into one of the following three categories: I) lithography on an insulating substrate, II) lithography of an insulating layer on a conducting substrate with no or only partial penetration of the beam to the substrate, and III) lithography of an insulating layer on a conducting substrate, with full penetration of the beam to the conducting substrate. These cases are illustrated in FIGS. 1a–1c, respectively. As shown in FIG. 1a, under electron irradiation 10 of an insulator 12, a charge density builds until eventually the resulting voltage exceeds the dielectric breakdown of the material and media between the material and ground. At this point, discharge occurs via conduction to the ground. This form of charge buildup and dissipation in e-beam lithography is highly undesirable. Very large electric fields are attained and the fields change unpredictably with time. For example, under these conditions we have measured voltages in excess of 100 V. In reality, the dielectric breakdown is determined by poorly defined and uncontrolled defects in the materials system. In Case III, the beam 10 penetrates the insulating layer 12 to the conducting substrate 16. Here, a small surface potential can develop due to the emission of secondary electrons 18 from the surface. Under these conditions we have measured surface potentials of magnitudes 2–10 V. In between the two extremes is Case II, that of an insulating layer on a conducting substrate with no or partial penetration of the insulating layer by the electron beam. If there is no penetration of the beam to the conducting substrate then the results are equivalent to those of Case I. If there is partial penetration of the beam we have found that electron-beam induced current (EBIC) effects are substantial. Penetration of as little as 25% of the beam to the conductor can lead to sufficient conductivity to dissipate any building charge, in which case the results are equivalent to Case III.

The same charging concerns are present for ion beam and X-ray lithography.

An important technological example of Case I is encountered in the manufacture of phase shift masks and optical devices on glass or quartz substrates. An example of Case II is encountered in low voltage e-beam lithography, such as with the low voltage micro-machined e-beam column arrays currently under development at ETEC, Inc. Most often, one uses a bilayer resist scheme for patterning in which the beam penetrates the top resist layer and the developed pattern is etched into an underlying polymer or dielectric layer. Case III is typically encountered with the low voltage e-beam lithography of thin, single layer resist systems, and higher e-beam voltage machines. The deflection of the e-beam due to sample charging will be most pronounced with the lower voltage and or greater working distance e-beam instruments.

SUMMARY OF THE INVENTION

Accordingly, it is an object of the present invention to provide a method of making an anti-charging layer for beam lithography (including electron beam, ion beam, and X-ray lithography) and mask fabrication.

Additional objects and advantages of the invention will be set forth in the description which follows, and, in part, will be obvious from the description, or may be learned by practice of the invention.

Objects of the present invention are achieved by applying a metal ligating self-assembled monolayer to a substrate, binding a metal to the ligand site of the metal ligating self-assembled monolayer and applying a resist to the metal.

According to one aspect of the present invention, there is provided a method of forming anti-charging layer for charged particle beam lithography, comprising binding a ligand self-assembled monolayer (SAM) to a substrate; binding a Pd catalyst to the ligand SAM; depositing an electroless metal layer on the Pd catalyst in order to create the anti-charging layer, the metal layer being continuous and conductive in order to permit charge dissipation, the metal layer being further transparent in the visible region; and coating the anti-charging layer with an imaging resist.

In another aspect, the present invention provides a method of forming an anti-charging layer for charged particle beam lithography, comprising applying an imaging resist to a substrate; binding a ligand to the imaging resist; binding a Pd catalyst to the ligand; and depositing an electroless metal layer onto the Pd catalyst in order to create the anti-charge layer, the metal layer being continuous and conductive in order to permit charge dissipation, the metal layer being further transparent in the visible region.

In a further aspect, there is provided a method for forming an anti-charging layer for charged-particle beam lithography, comprising i) binding a first ligand layer to a substrate; ii) binding a catalyst to the first ligand layer; iii) depositing an electroless metal anticharging layer on the catalyst, the metal anticharging layer being continuous and conductive in order to permit charge dissipation, the metal anticharging layer being further transparent in the visible region; iv) applying a polymer imaging resist layer on the anticharging layer; v) depositing a second ligand layer on the polymer imaging resist; vi) binding a catalyst to the second ligand layer; and vii) depositing an electroless metal anticharging layer on the catalyst in step vi.

The technique can be carried out on a non-patterned surface, a patterned surface, or a planarizer. The resist can be a self-assembled monolayer film or a composite self-assembled monolayer film.

DESCRIPTION OF THE PREFERRED EMBODIMENTS

Figure 1A:
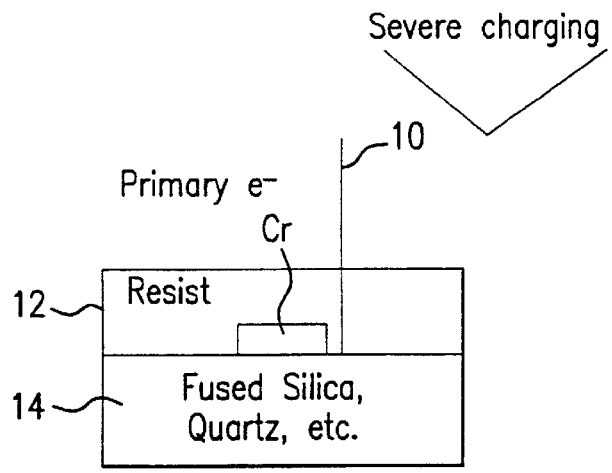
FIGS. 1a through 1c are a collection of schematic diagrams of conditions that produce charging problems in e-beam lithography.
Figure 1B:
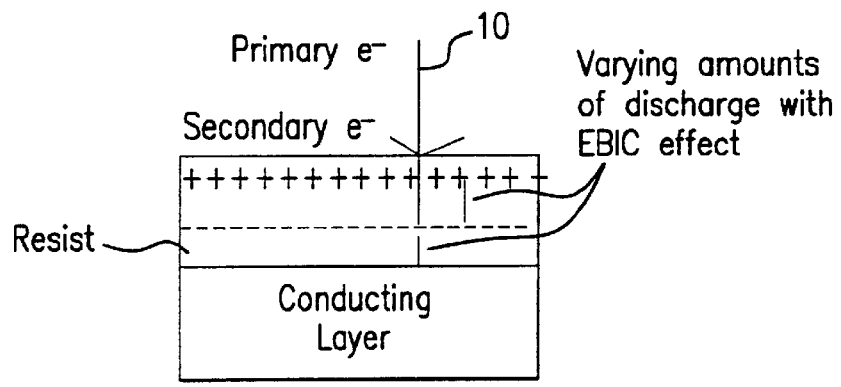
Figure 1C:
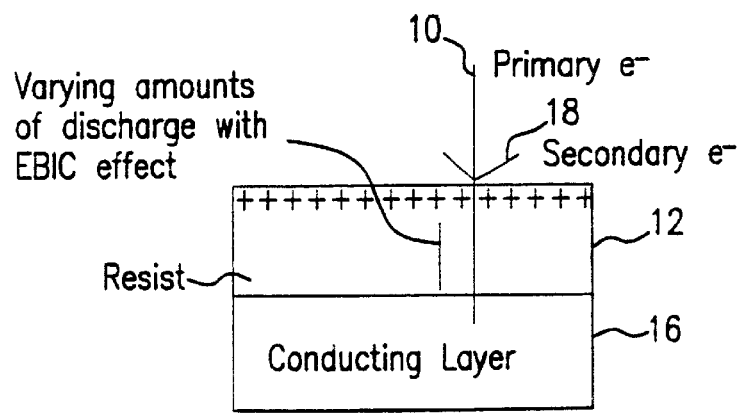

The invention is based upon the use of ultrathin grounded conducting layers to act as both discharge layers and as a shield from electric fields that may exist beneath the imaging layer within the sample, since the presence of an electric field in a conductor is forbidden by Maxwell's equations. The invention uses ultrathin metal films 24 bound to metal ligating self-assembled monolayers 26 (SAMs) as discharge layers. The invention includes both materials and processes useful for the fabrication of the discharge layers. A key to the invention is the use of bifunctional molecules, in which one functional group is capable of binding to the resist or substrate and a second functional group is capable of binding metal or metal ions. The molecule can bind to the substrate via either physisorption or chemisorption. The bifunctional molecules typically are organosilanes possessing alkoxysilane or halosilane groups capable of binding to surface hydroxyl sites on the substrate 20 or resist 22 and an organofunctional group containing a ligand, such as a primary amine or pyridyl group, capable of binding a metal 24 or metal ion. That is, they are usually materials of the general formula $RSiR'_nX_{3-n}$ (where R is an organofunctional group having a metal ligating site, R' is typically a small alkyl group such as the methyl or ethyl group or a simple aromatic group such as the phenyl group, X is an alkoxide such as methoxide or a halide group such as chloride or bromide, and n is zero, 1, or 2). The organosiloxane SAM 26 can be deposited onto a variety of surfaces by either wet chemical dipping or spincasting from organosilane solution. Subsequent binding of an electroless Pd/Sn catalyst species to the ligand site of the SAM, followed by immersion of the substrate in an electroless metal bath, deposits an ultrathin layer of conductive metal 24 on the substrate 20. Various conducting metals, such as Cu, Co, Au, and Ni, among others, can be deposited in this manner with thicknesses controlled by the metallization conditions (i.e., concentration, time, and temperature). Other methods that are currently employed to reduce or eliminate charging involve the vacuum deposition of metal films or spincasting of conducting polymers. The advantages of SAM assisted metal attachment over the current schemes is discussed below.

Figure 2A:
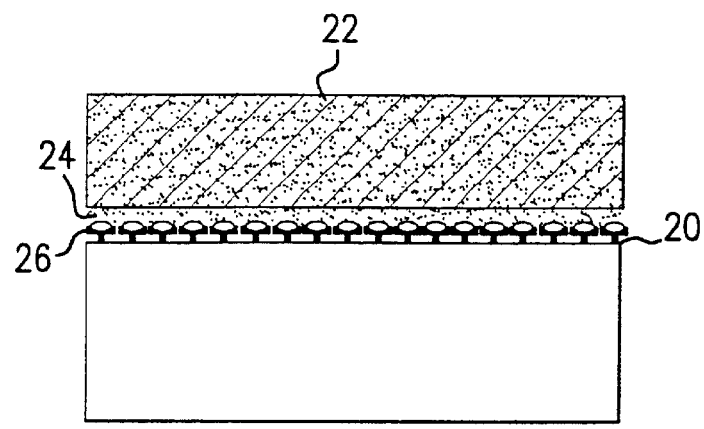
FIG. 2 is a collection of schematic diagrams of the use of a SAM-metal layer to reduce charging in e-beam lithography.
Figure 2B:
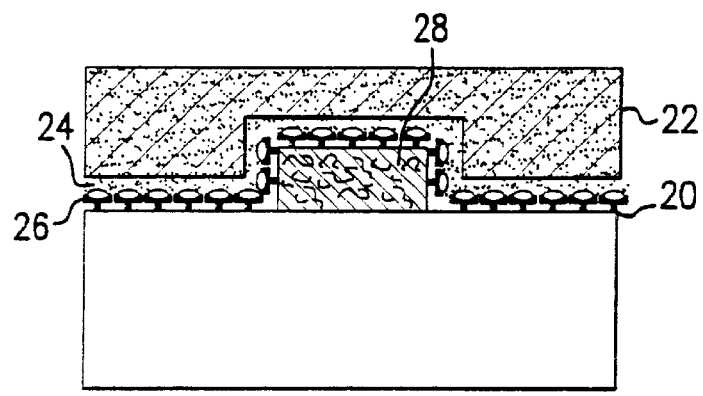
Figure 2C:
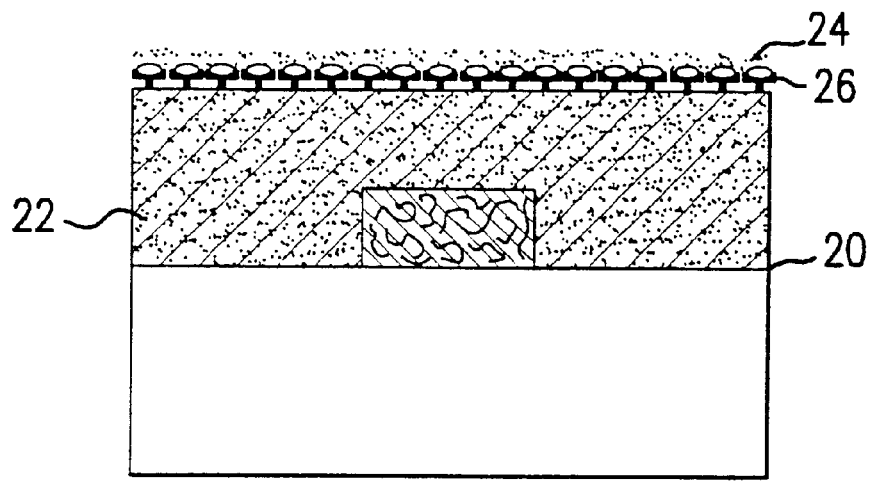
Figure 2D:
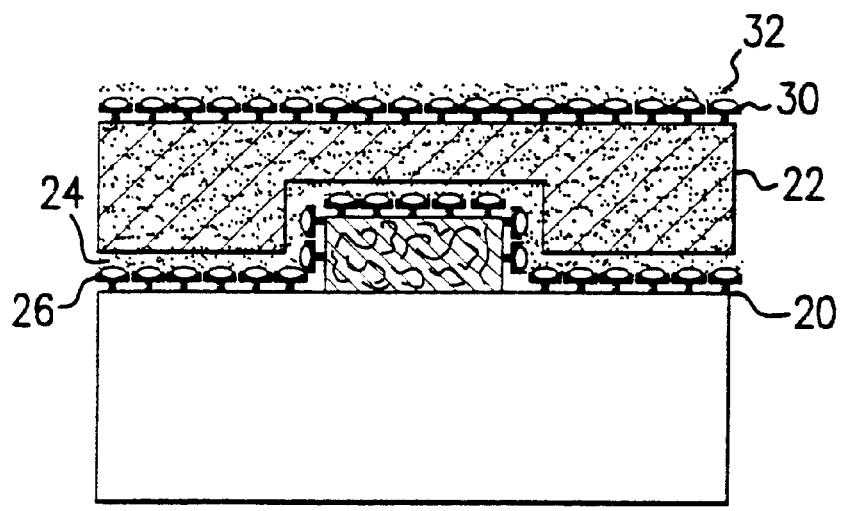
Figure 2E:
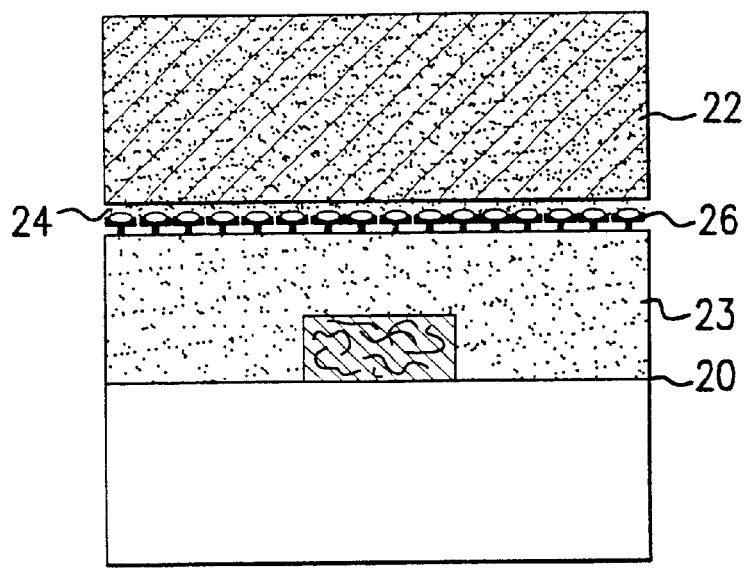
Figure 2F:
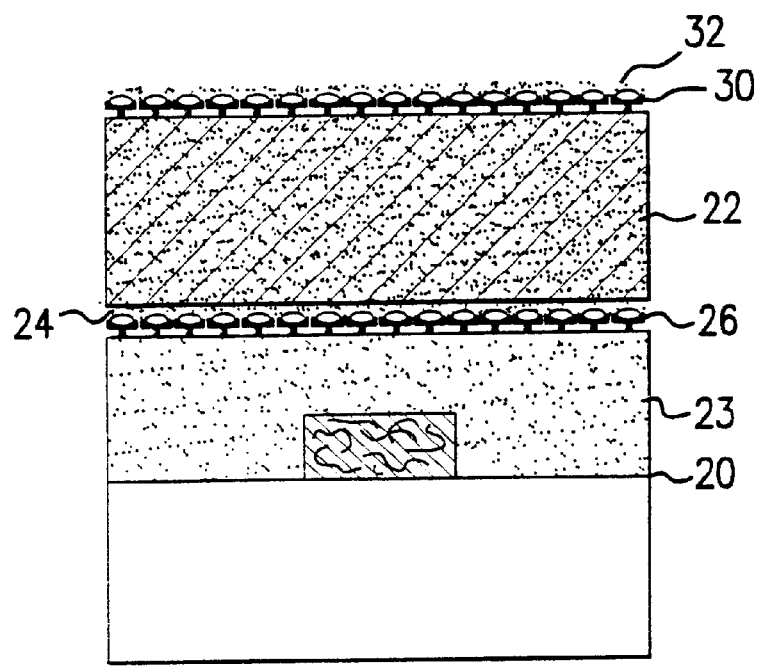
Figure 2G:
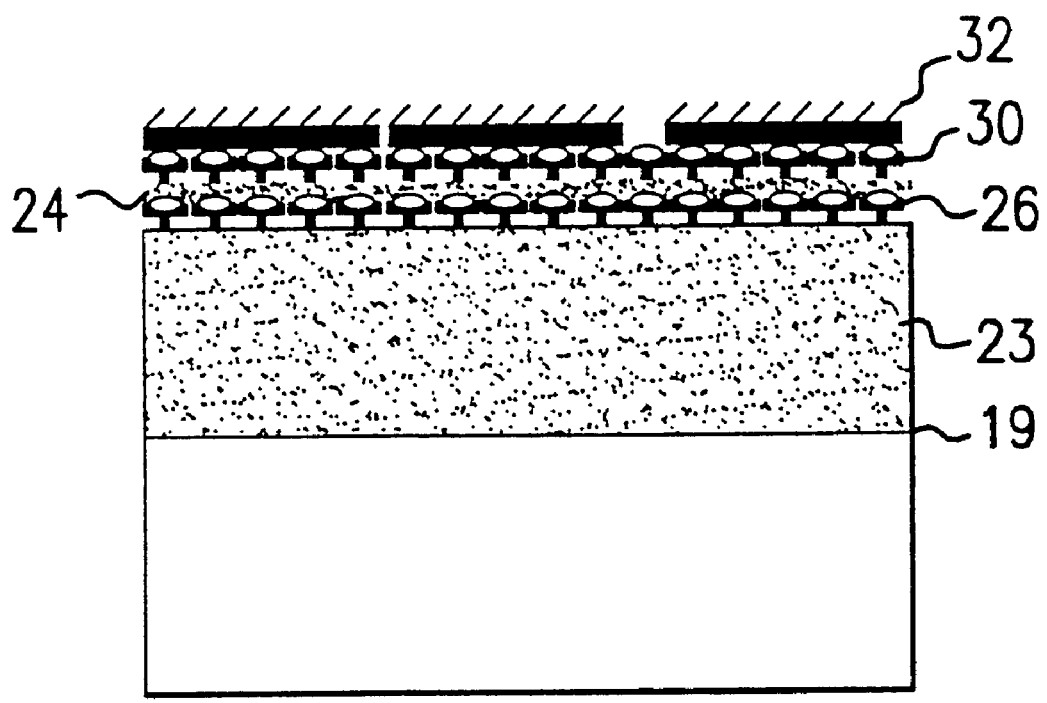

Several schemes by which metal-binding SAMs 26 can be used to reduce or eliminate charging effects in e-beam lithography are shown in FIGS. 2a–2d. The term e-beam lithography is defined to include beams of charged particles such as electrons or ions impacting the substrate used to pattern the substrate with the outer layers of the substrate. The substrate can be a non-patterned 19 surface (FIG. 2a), a patterned surface 20 (FIGS. 2b–2d), or a surface with a planarizer 23 (FIGS. 2e–2g). In all cases the metal layers are grounded during e-beam lithography. The SAM/metal layer 26 can be placed directly on an insulating substrate 19 (FIG. 2a) or on an insulating substrate containing a pattern 20 (FIG. 2b), e.g. patterned Cr on a quartz mask. The scheme of FIGS. 2a–2b reduces the severe Case I charging to the minimal charging of case III. In FIG. 2c, the SAM/metal layer 26 is placed on top of the resist 22. Because the electric field must be zero in the conducting layer, no electric field extends from the sample surface to deflect the electron beam. In FIG. 2d, two SAM/metal layers 26 are employed, one at the resist 22 top surface and one on the substrate 20 surface. The layer 26 that is on the resist 22 surface once again prohibits the formation of an electric field arising from substrate 20 effects. The layer 26 at the substrate facilitates imaging the substrate 20 surface for alignment purposes. In all cases the SAM-metal layer 26 follows the topography of the surface. Note that a SAM film or a composite SAM/physisorbed ligand film can also be used as a resist, provided that the film's chemical functionality can be modified by exposure (in this case, by an e-beam). This is illustrated in FIG. 2g, where a second SAM 30 is coated over the first metal layer 24 and lithographically exposed. The second metal 32 binds to the top SAM 30 selectively in the exposed pattern. In this case, the second metal 32 is chosen to have different etch characteristics than the first to facilitate etching and pattern transfer. An example of such a bilayer scheme would be a patterned Ni, Au, or Cr coated SAM layer on top of a Cu-SAM layer.

The invention described herein offers several advantages compared to the current state of the art. Currently used methods for reducing charging include the vacuum deposition of a metal film on the surface or the spincoating of a conducting polymer, such as polyaniline, on top of the resist. The first technique adds a process step that is too time intensive for a viable manufacturing process. The process requires that the workpiece be placed in a vacuum system, the system evacuated, and metal deposited. The process is slow, requires a major piece of equipment in the clean room. In addition, it is difficult to consistently deposit thin, continuous metal films using vacuum deposition methods. The techniques described in this disclosure utilize low-cost wet chemical processing involving simple dipcoating or spincoating steps for application of the charge dissipation layer. The use of electroless plating without the metal-binding organosiloxane film offers similar cost advantages to our method. However, metal films produced in this manner are not sufficiently continuous to function as effective charge dissipaters unless their thickness exceeds ~100 nm. Metal films of this thickness are of limited use as charge dissipaters because they facilitate excessive scattering of the e-beam, compromising patterning and measurement of alignment marks.

Spincast polyaniline films also require thick films to achieve sufficient conductivity to dissipate charge and are therefore similarly undesirable. The requirement that thick conducting polymer films be used to sufficiently dissipate charge also limits the ability of an operator to view substrate alignment marks during patterning. In addition, outgassing of the dopant required to maintain conductivity of the polyaniline in the vacuum system during patterning severely limits the effectiveness of this material. Finally, polyaniline exhibits sufficient water solubility such that, if used as a layer under the photoresist, it could promote photoresist delamination and liftoff during pattern development. Consequently, the disclosed invention offers a unique, low-cost means for controlling workpiece charging that is unmatched by current methods and meets the needs of lithography practitioners.

Persons of ordinary skill in the art know that SAMs may by deposited by either chemisorption or physisorption. See generally, Brandow et al, copending application Ser. No. 09/339,917, incorporated by reference herein.

In some instances, a surface to which a SAM is to be deposited will require pretreatment to have the preferred surface chemistry for SAM deposition. Typically, one may create surface OH groups on the substrate surface by $O_2$ plasma etching the surface briefly. Most resists and planarizers do not have a sufficient level of surface OH to chemisorb a good ligand organosiloxane film. The ligand organosiloxane can then be chemisorbed onto a substrate to create a ligand SAM (self-assembled monolayer) film. A Pd catalyst can then be bound to the ligand. The binding is covalent. The Pd catalyst is capable of initiating and sustaining electroless metal deposition. The catalyzed SAM can then be treated with an electroless metal bath to deposit an ultrathin metal film onto the surface as the anti-charging layer.

A preferred method for the chemisorption of the ligand SAM follows. First, the nature of the precursor monomer for the ligand SAM is $RSiR'_nX_{3-n}$, where R is a ligand group, R' is an alkyl or aromatic hydrocarbon group, X is an alkoxide or halide group, and n is 0, 1, or 2. The ligand group R is a group that can covalently bind the catalyst Pd species. R is therefore alkylamine, pyridine, diphenylphosphino, etc.

A SAM need not be an organosilane. It can also be a polymer film having pyridyl, etc. ligand groups as part of the polymer structure. In such a case, the substrate can be coated directly with a ligand polymer film. The ligand can also be a polymer ligand such as pyridine, dimethylamine, etc. that is physisorbed onto/into the substrate such that the physisorbed ligand retains its ability to covalently bind the Pd catalyst species.

The method of applying the metal ligating SAM to a substrate can vary. For example, spincoating can be used (as with an organosilane or ligand polymer). Dipcoating can also be used (as for an organosilane or a monomeric ligand for physisorption).

The ligand surface can be applied to or contacted with $Pd^{II}$ salts or $Pd^0$ materials. It is usually important that sufficient $Pd^{II}$ or $Pd^0$ is bound to initiate and sustain electroless metal deposition and that $Pd^{II}$ or $Pd^0$ is bound in a sufficiently homogenous fashion to ensure deposition of an ultrathin conductive metal film.

The preferred catalyst systems are commercial Pd/Sn colloids. Such colloids usually require several processing steps prior to metallization. Specifically for Shipley Co. Cataposit 44® Pd/Sn catalyst: treat the substrate with Pd/Sn catalyst for about 5 mins, rinse with 0.1 M HCl three times, apply Shipley accelerator 19® solution for 90 secs (about 10% strength), rinse once with $H_2O$, and then plate with a metal bath.

For the metal deposition, any of several metals can be used including Co, Cu, Ni, or Au. Copper metal is preferred due to the combination of low cost, good electrical conductivity, and ease of removal by acid etching. Preferred in combination with the Shipley Co. Cuposit 328® copper metal bath is the Pd/Sn catalyst.

Metallization using physisorbed ligands is slightly different than using chemisorbed ligand organosilanes as films for catalyst binding. There are two preferred pathways. In the first, organosiloxane SAMs are used, however, the SAM is not a ligand. Its R group is a simple alkyl or aromatic species. A solvent is chosen that is geometrically matched to the R group of the silane for deposition. For aromatic R groups, aromatic solvents like toluene are used. For aliphatic R groups, a long chain alkyl solvent like dodecane is used. It is known that use of geometrically matched solvents leads to less dense packing of the SAM R groups during the chemisorption process. The "spaces" or "voids" between adjacent R groups in the SAM can physisorb similarly matched ligands. For example, voids in cast octadecysiloxane SAMs prepared using hexadecane solvent can bind n-hexadecylamine ligand via ligand insertion. The amine group of the bound ligand can bind catalyst and give metal deposition. A similar situation occurs using aromatic organosiloxane SAMs with pyridine or other aromatic ligands.

A second path uses spincoated polymers for physisorption. This is similar as for non-ligand organosiloxane SAMs. For example, spincoating the non-ligand polymer polyvinylbenzyl chloride from the aromatically matched solvent, toluene, creates loosely packed polymer film having voids at the surface (templated by toluene). The aromatic ligand, pyridine, can be physisorbed into these voids and thereby metallize the polymer surface.

Once the ligand surface is prepared, catalysis and metallization proceed as per the steps described above for binding a Pd catalyst and treating the catalyzed SAM with an electroless metal bath.

If a polymer contains Pd-binding ligands like pyridine, it can be spincoated as a planarizing layer or conformal layer onto the substrate. Because the coated surface now has ligands on it (because the ligand groups are part of the polymer structure) and direct catalysis/metallization can occur.

A preferred feature for the metal deposit is that it can carry a current from anywhere on the metal deposit to a ground connect, which will typically be at or near the edge of the deposit.

For metal deposits over a resist layer, it is desired to have the metal deposit be sufficiently transparent to the exposing beam so that the beam can successfully expose the resist through the metal deposit. Also, it is desired to have metal deposits that are sufficiently transparent, so that alignment marks and other features are visible through the deposit. Typical metal deposits will be between 15 and 20 nm thick.

EXAMPLES

Having described the invention, the following examples are given to illustrate specific applications of the invention, including the best mode(s) now known to perform the invention. These specific examples are given with the understanding that they are not intended to limit the scope of the invention described in this disclosure.

Example 1

Figure 3:
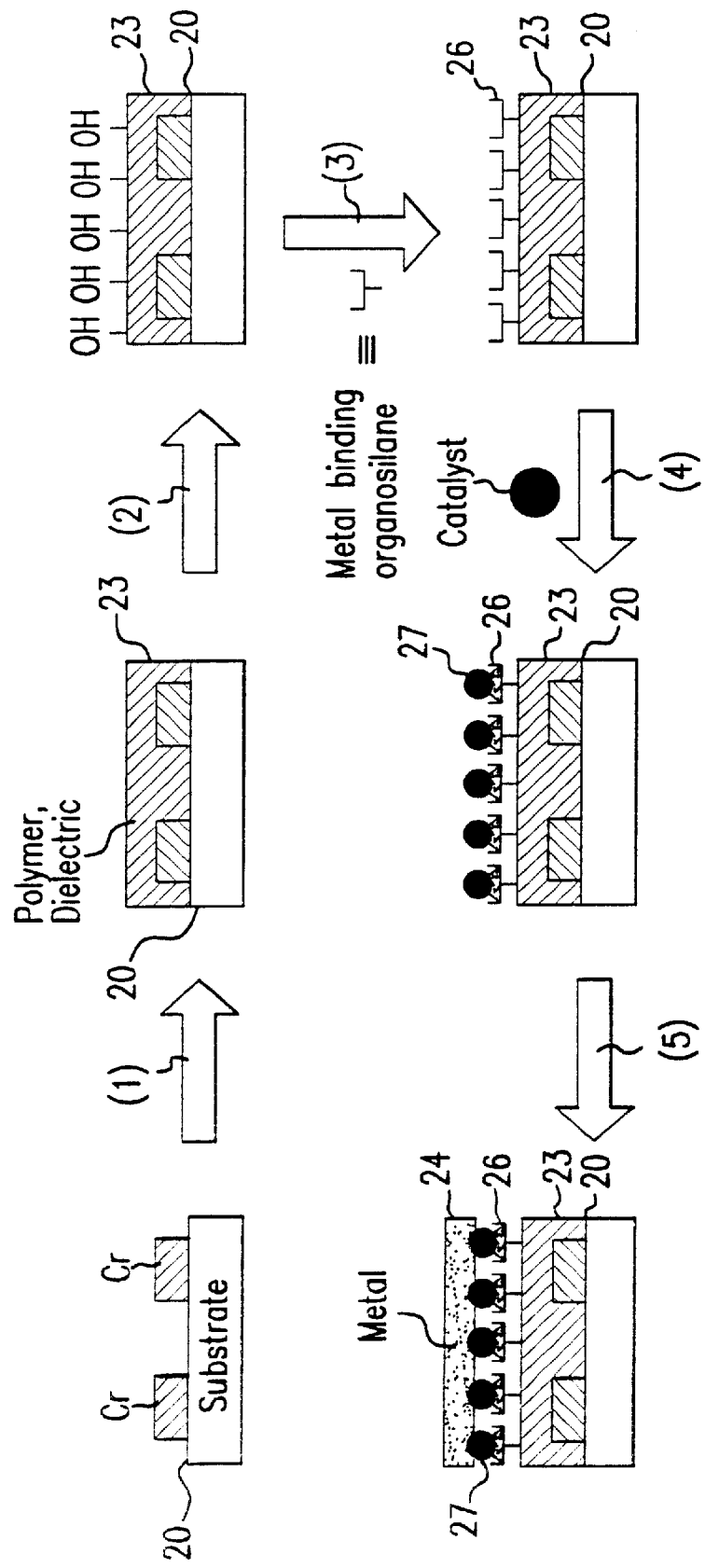
FIGS. 3–4 are schematics showing the successive stages of using a SAM-metal layer to reduce charging in e-beam lithography using electroless plating of metal on SAM on bare substrate or polymer prior to photoresist coating.
Figure 4:
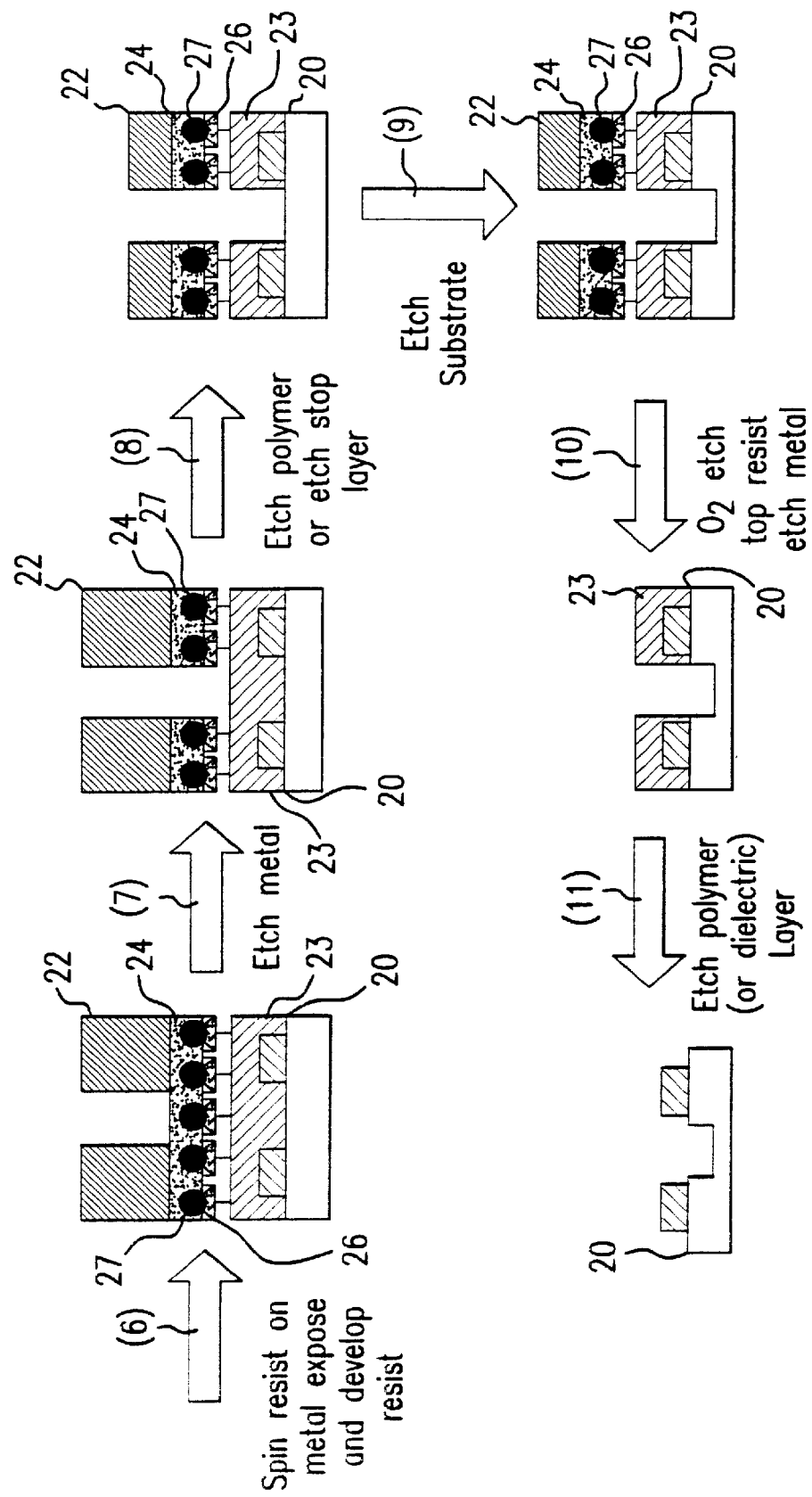

This example illustrates the fabrication and processing of a metal-coated substrate as an anti-charging layer for e-beam lithography. FIGS. 3 and 4 show diagramatically a proven means to fabricate an ultrathin metal layer useful for charge dissipation on an insulating substrate surface. Although FIG. 3 shows a substrate of patterned Cr on glass, the process can be used for any substrate that is compatible with the e-beam tool. The process flow is shown for a substrate with a planarizer or etch-stop layer. The process can be applied to a substrate without the planarizer layer by omitting steps 1, 8, and 11. Step 2, a brief $O_2$ etch, can be omitted if the surface is hydroxylated and clean or if the SAM binds to the surface without the $O_2$ etch. If the planarizer option is not selected the substrate surface should be cleaned with normal degreasing methods. [Surfaces of oxide] Oxide surfaces (native or ceramic) generally possess the hydroxylated groups in sufficient numbers for organosilane attachment. Following the surface or planarizer preparation, the ligand SAM organosilane layer is deposited from a 1% (by volume) aqueous solution of (2-aminoethyl)-3-aminopropyltrimethoxysilane (EDA) containing 0.001 M acetic acid (pH 5). A puddle of the EDA solution is placed on the substrate surface for ~15 sec. Excess solution is removed by spincasting at 3000 rpm for 15 sec while rinsing the substrate in a stream of water, followed by spinning an additional 15 sec to remove the water. The substrate is dried by baking at 120° C. for 4 min to complete the chemisorption of the EDA SAM. A Pd/Sn catalyst (Shipley Cataposit®44) 27 is next applied for 5 min and the sample is gently rinsed three times in 0.1 M HCl (aq) as directed by the manufacturer. Next, an accelerator (Shipley Cuposit® Accelerator 19, a solution containing fluoroboric acid or equivalent species for dissolution of Sn(II) and Sn(IV) salts in the Pd/Sn catalyst) is applied for 90 sec and removed as directed by the manufacturer. Cu is then deposited by immersion of the substrate in Shipley 328® Series EL Cu bath (an electroless copper metal deposition bath) for 30 sec at 25° C. As shown in FIG. 4, the resist is then spun onto the Cu coated workpiece and processed, exposed, and developed under standard conditions. The developed pattern is wet-etched into the ~15 nm thick Cu layer by a 5–10 sec immersion in a 50% $HNO_3$ solution (FIG. 4, Step 7). The $HNO_3$ process was not found to etch Cr on a mask. Following the Cu etch, the pattern is etched into the planarizer (if present) (FIG. 4, Step 8) and then into the substrate (FIG. 4, Step 9) using standard wet or plasma etches, as applicable. In FIG. 4, Step 10, the resist is removed by standard processes such as an $O_2$ plasma etch, followed by a 5–10 sec immersion in 50% $HNO_3$ to remove the remaining Cu discharge layer. In FIG. 4, Step 11, the planarizer (optional) is removed by standard techniques.

Example 2

Figure 5:
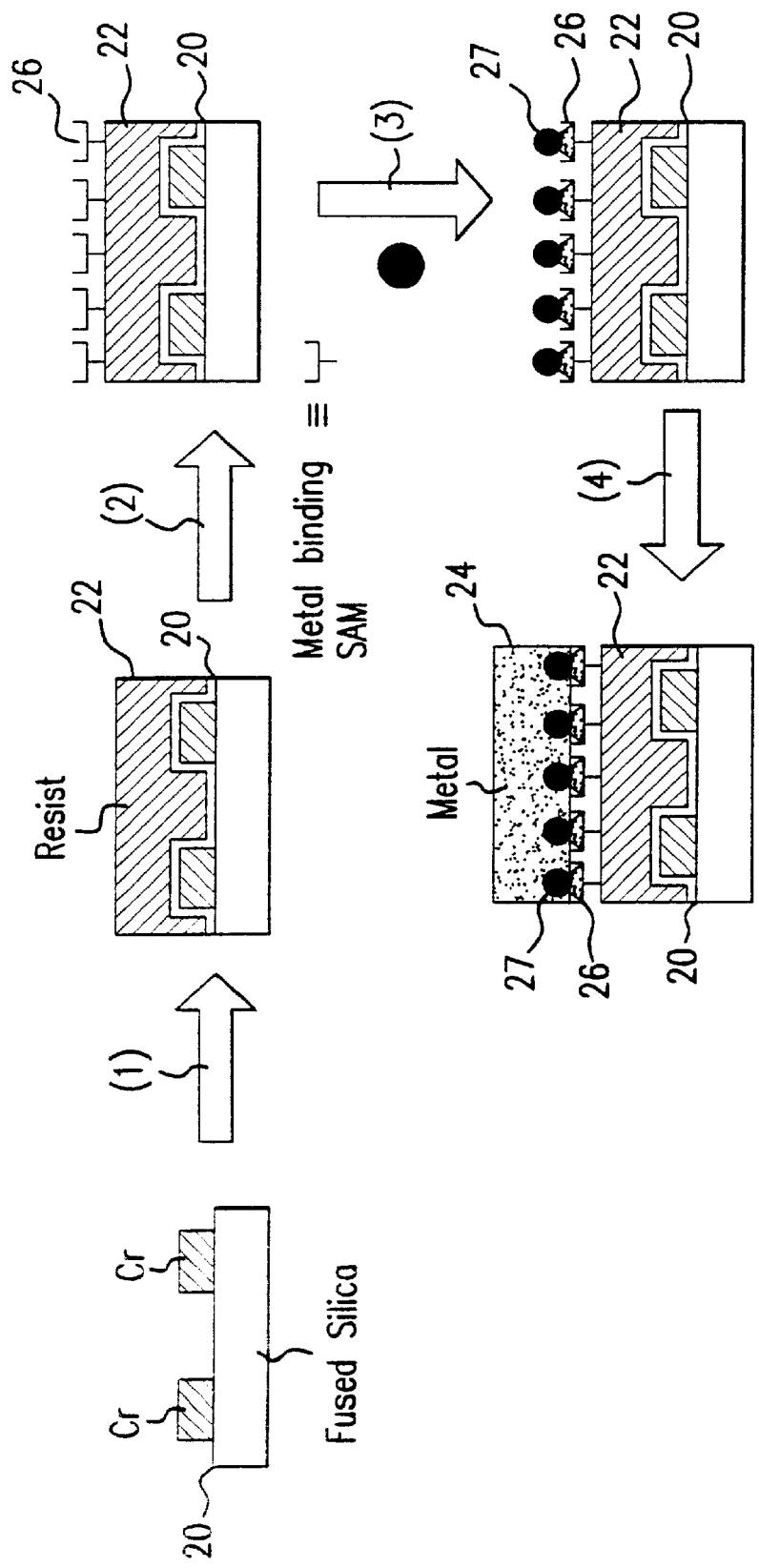
FIGS. 5–6 are schematics showing the successive stages of using a SAM-metal layer to reduce charging in e-beam lithography using a substrate with SAM/metal discharge layer on top of the resist.
Figure 6:
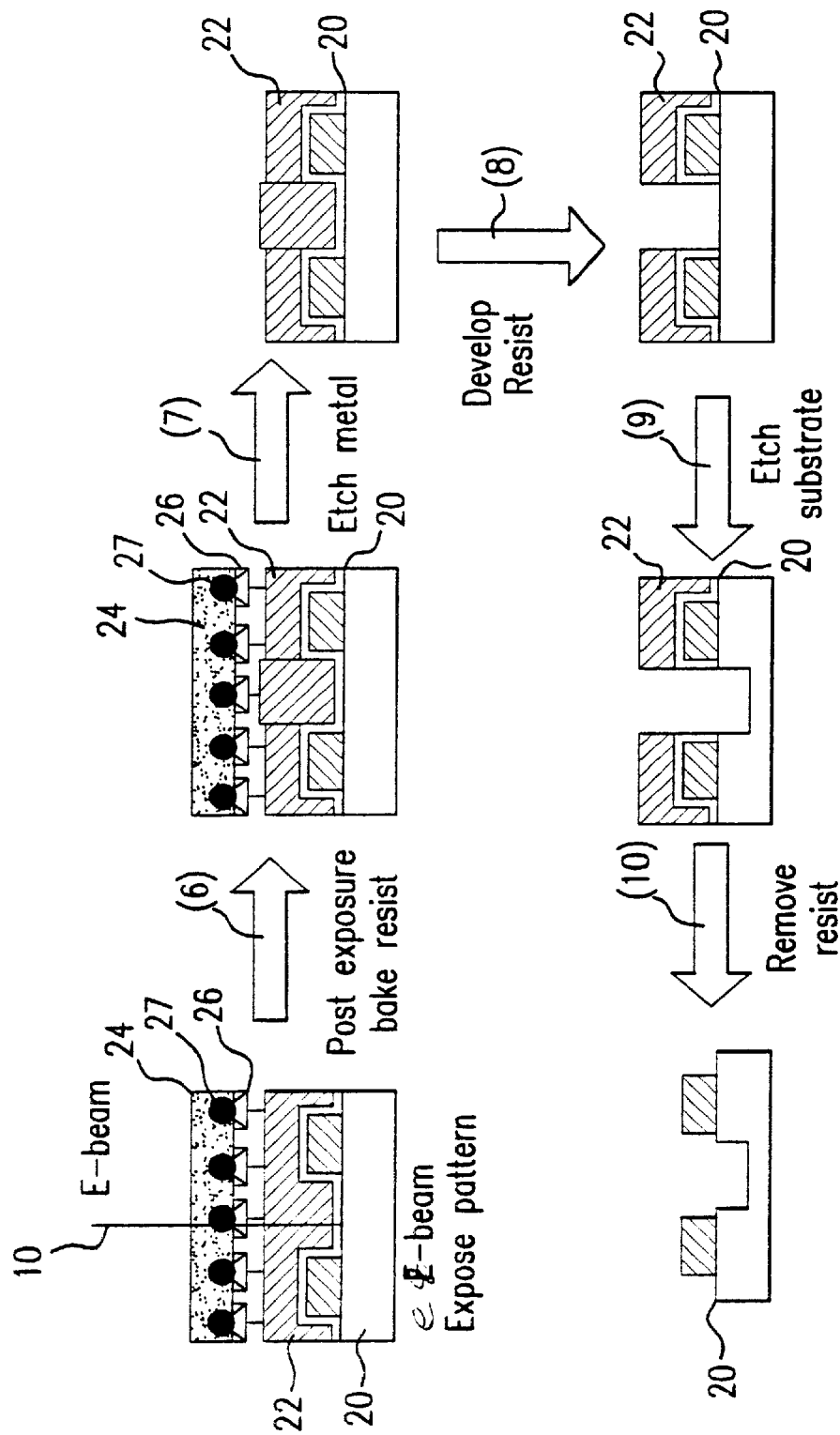

This example illustrates the fabrication and processing of a metal-coated resist as an anti-charging layer for e-beam lithography. Shown in FIGS. 5 and 6 is the process flow for e-beam lithography with the SAM-Cu layer on top of the resist. (Approach of FIG. 2(c)). Although FIG. 5 shows a substrate of patterned Cr on glass, the process can be used for any substrate that is compatible with the e-beam tool. In step 1, the resist is deposited onto the substrate using standard techniques. A SAM is deposited onto the resist in step 2 though the spincoating process as described in Example 1 above or alternatively by dipcoating the substrate in the SAM solution. Yet another method to apply a metal binding SAM layer is through physisorption. The metal film is then formed on the SAM-coated resist surface following catalysis (step 3) and electroless metal deposition (step 4) using conditions described in example 1. After patterned e-beam exposure, the metal is removed using the $HNO_3$ wet etch of example 1. Subsequent resist development and pattern transfer then proceed according to standard routes, as shown in FIG. 6.

Example 3

Figure 7:
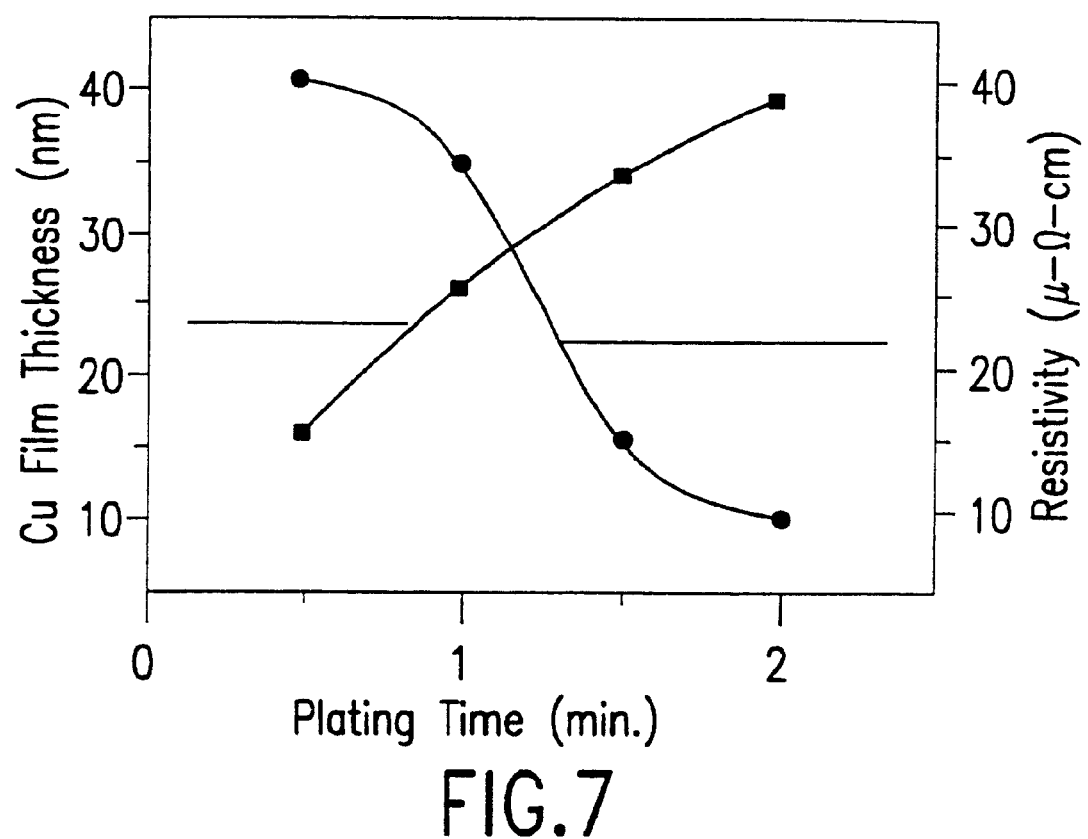
FIG. 7 is a graph showing the relationship between copper film thickness and plating and the relationship between resistivity and plating time.

This example demonstrates the fabrication of a highly conductive ultrathin metal layer according to the method of the invention. The procedure described in example 1 above for the fabrication of a substrate coated by an ultrathin metal film, as illustrated in FIG. 3, was repeated using an unpatterned substrate. Specifically, planar Si wafers not bearing Cr patterns were used. Electroless Cu depositions (step 5 of FIG. 3) were carried out for different times ranging from 30–120 sec. Following metal deposition, metal thicknesses were determined using surface profilometry and electrical conductivities were measured using a standard 4-point probe approach. Shown in FIG. 7 are curves of Cu film thickness vs. plating time and Cu film resistivity vs. plating time. The curves are for Cu film deposition on EDA on glass via the deposition process described above in Example 1. The results indicate that a reasonably uniform 15 nm thick metal film can be deposited with a resistivity of 40 $\mu\Omega$-cm. A novel feature of the process is the use of the metal-binding SAM, which allows the attachment of a very thin (15 nm) continuous low-resistivity Cu film. Without the EDA SAM layer, metallization quality and completeness were compromised. For some substrates, no Cu deposition was observed. In other cases, although Cu was deposited, continuous Cu films were not obtained for film thicknesses <100 nm.

Example 4

Figure 8:
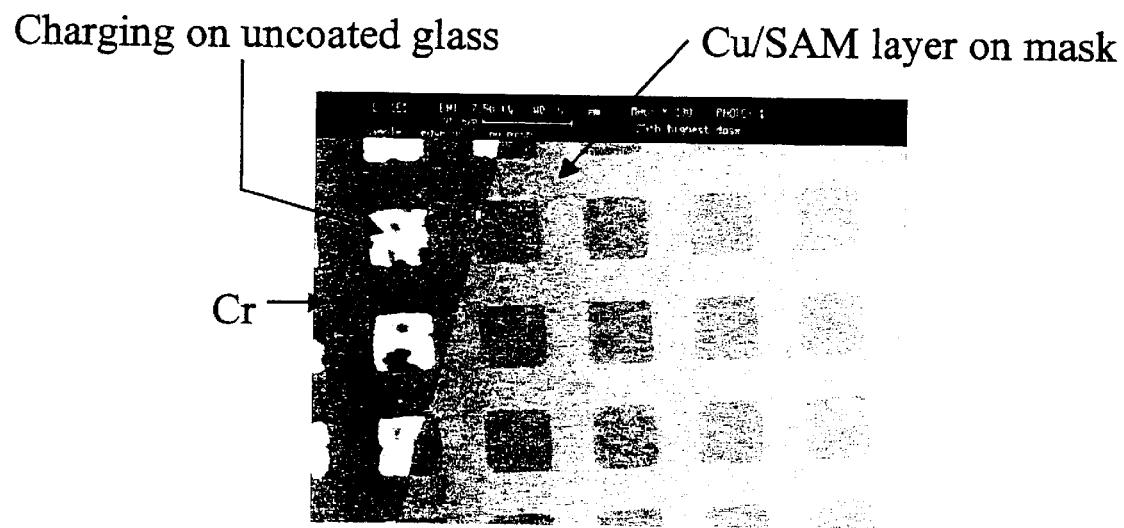
FIG. 8 shows the effect of copper plating on EDA SAM on patterned chromium on glass mask on charging.

This example demonstrates the efficacy of the ultrathin metal layer described in examples 1 and 3 in dissipating charge buildup on an insulating substrate during e-beam exposure. Shown in FIG. 8 is a SEM micrograph of a Cr on glass mask partially coated by Cu using the process of FIG. 3 according to the conditions of example 1. In the leftmost region, where the Cu/SAM layer is absent, charging is observed on the glass, as noted by the white areas indicative of charged surfaces. The charging is not observed in the rightmost region, which is covered by the Cu/SAM layer. Note that, due to the ultrathin nature of the Cu/SAM layer, observation of the underlying Cr/glass pattern is preserved. Consequently, the Cu/SAM coated regions satisfy both the anti-charging and transparency conditions required for use as charge dissipation layers in e-beam lithography. This allows imaging for alignment as well as potential use in the preparation of routine SEM samples for high-resolution imaging.

Example 5

Figure 9A:
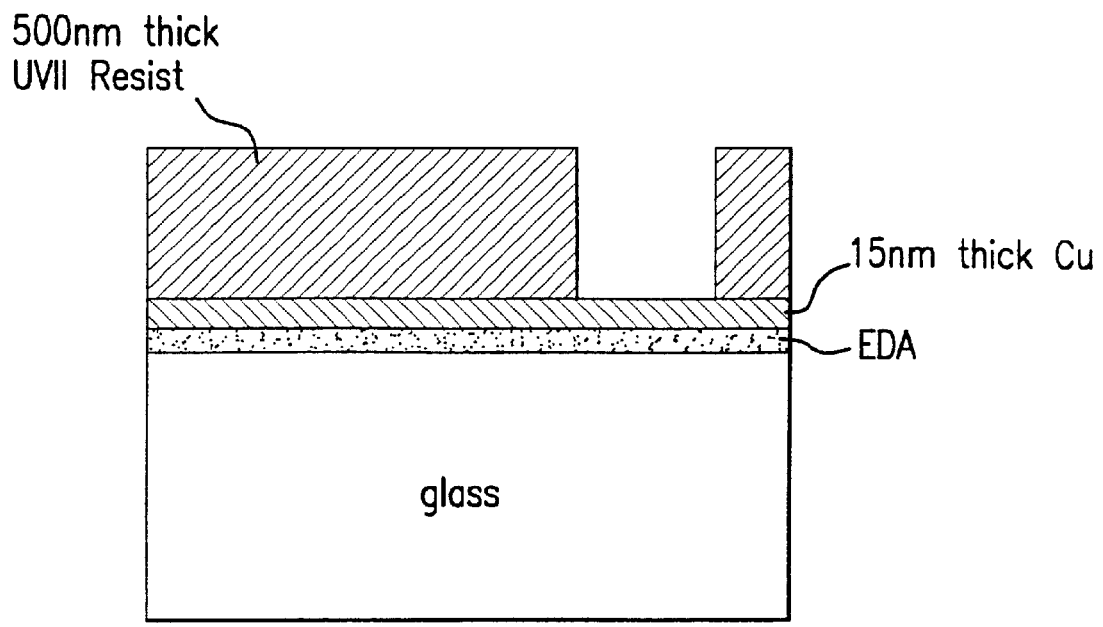
FIG. 9 shows a demostration of the elimination of electron beam induced charging in 500 nm thick layer of UVII resist on a glass substrate by the inclusion of a 15 nm Cu layer on EDA on the glass substrate and 25% e-beam penetration of the resist.
Figure 9B:
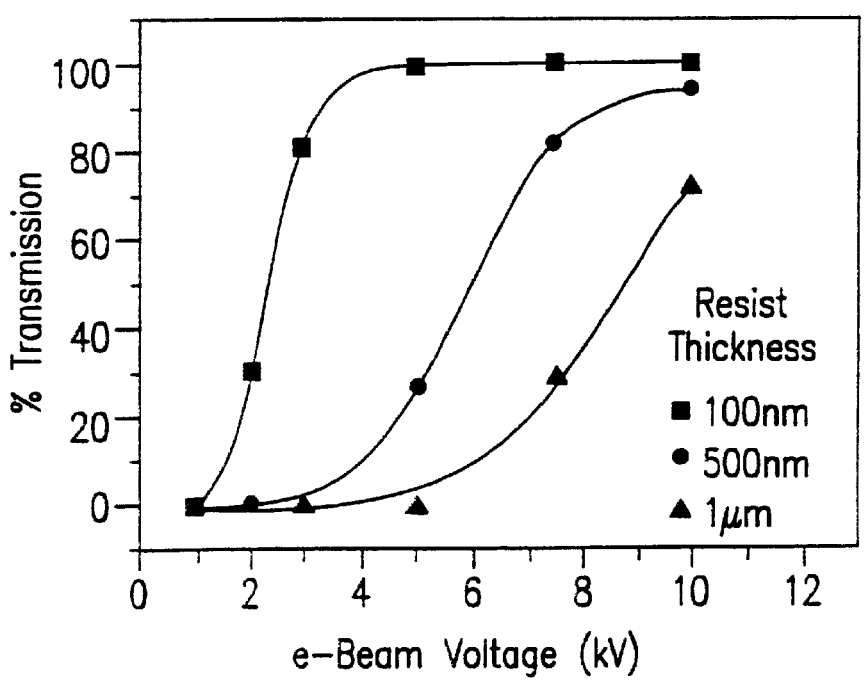
Figure 9C:
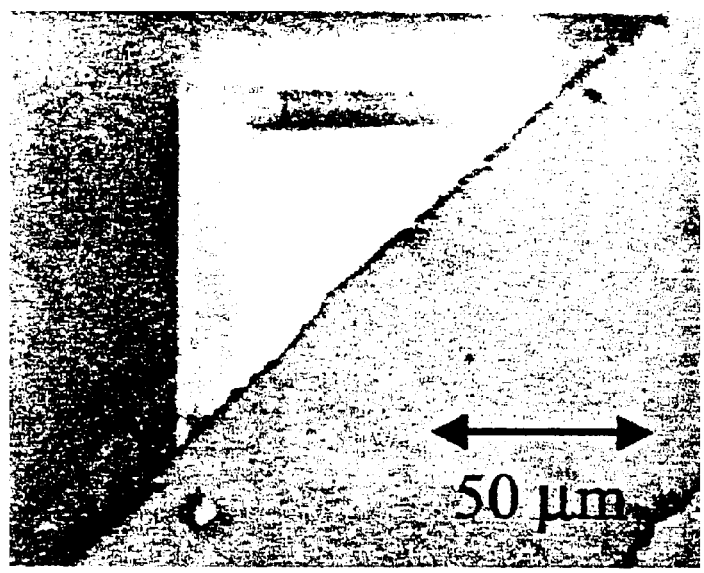
Figure 9D:

This example demonstrates the use of an ultrathin metal film at the substrate-resist interface as a charge dissipation layer under e-beam irradiation. Shown in FIG. 9 are: (a) a cross-sectional diagram of the sample shown in (c) and (d); (b) a graph of % transmission (calculated via Monte Carlo simulation) of an electron beam through a resist vs. resist thickness for different beam energies; and (c) and (d) SEM micrographs at 3 kV and 5 kV, respectively, of a resist on a glass substrate sequentially coated with a 15 nm thick Cu/EDA layer and 500 nm of UVII resist. Severe charging in the SEM image is seen in FIG. 9(c) as bright areas denoting previously irradiated areas. The Monte Carlo simulation predicts zero beam penetration of a 3 kV electron beam through the 500 nm thick resist, a condition under which we expect and observe severe charging. Similarly, the Monte Carlo code predicts 25% transmission of a 5 kV electron beam through 500 nm of resist. In this case essentially no charging is observed as seen in FIG. 9(d). The 25% beam transmission is clearly sufficient for electron beam induced current (EBIC) effects to dissipate any charge build up through the Cu/EDA layer underlying the resist. Additional observations of the dissipation of charge through EBIC effects were also noted for 100 nm, 500 nm, and 1 $\mu$m thick resist on Cr on glass via SEM and/or Auger electron spectroscopy. FIG. 9(d) also again confirms that the 15 nm Cu/EDA layer is completely sufficient to eliminate the severe charging.

Example 6

Figure 10A:
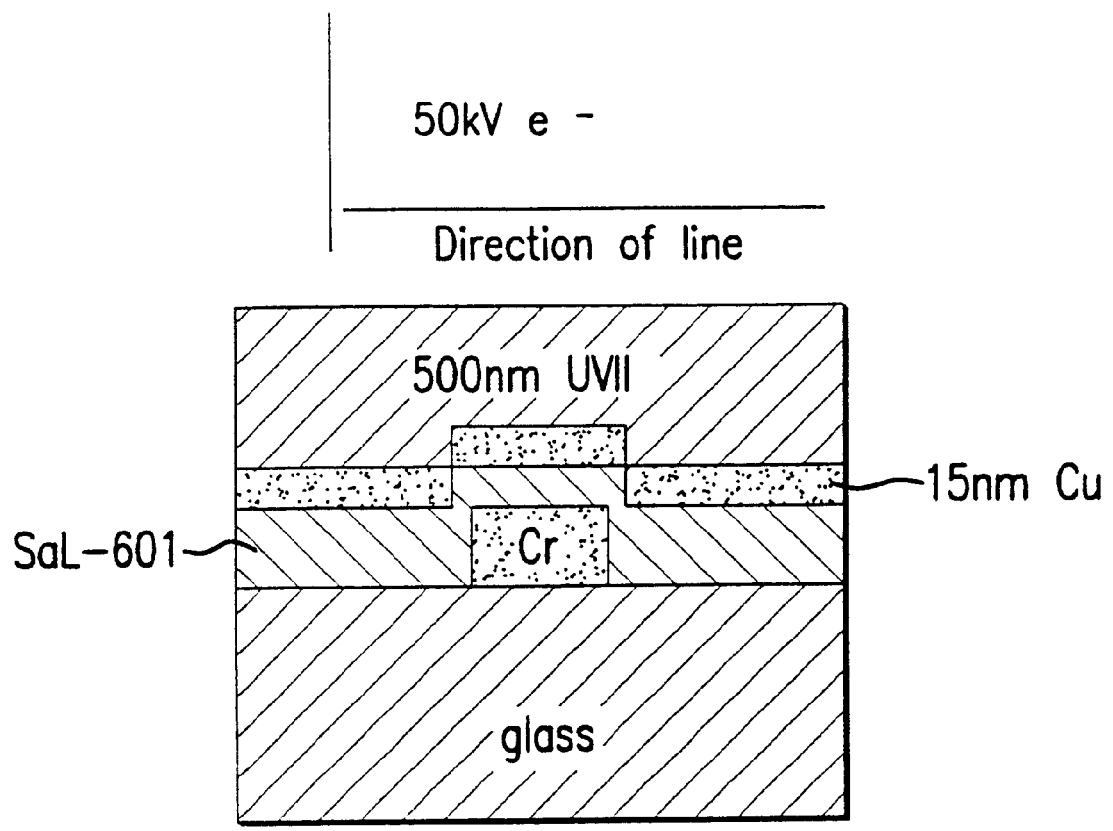
FIG. 10 shows e-beam lithography with 15 nm Cu layer under the resist as a discharge layer for Cr on glass mask.
Figure 10B:
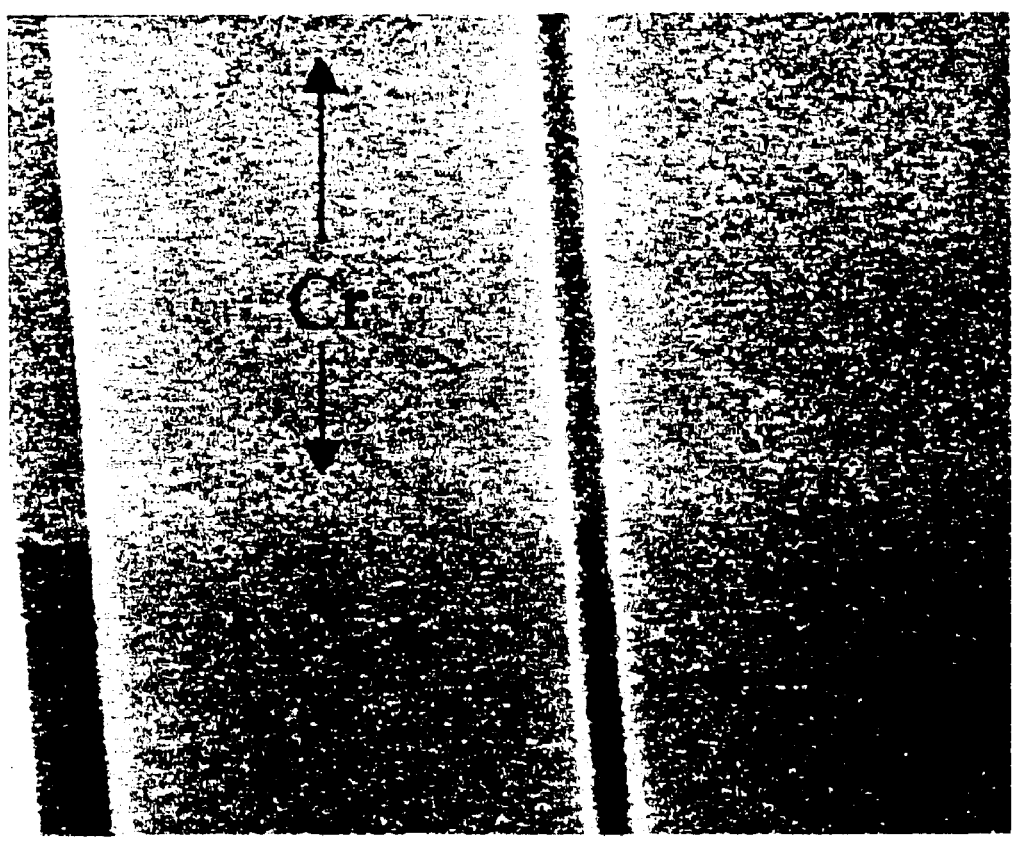

This example illustrates the use of a 15 nm thick Cu/EDA layer on a planarizer, as described in FIGS. 3 and 4 and Example 1, to dissipate charge and maintain feature continuity across a chrome to glass boundary. Shown in FIG. 10 is a developed e-beam lithographic pattern in UVII positive chemically amplified resist on a 15 nm thick Cu/EDA layer, which coats a cross-linked SAL-601 resist (Shipley) etch-stop layer on a patterned Cr on glass mask substrate. Only the 15 nm Cu/EDA layer is grounded. A cross-sectional schematic of the sample is shown in FIG. 10(a) and a top view of the sample following exposure and development is shown in FIG. 10(b). The continuity of the lines represented by the vertical channels, as they cross from the chrome to glass regions of the underlying substrate, is maintained within $\leq$1 nm lateral variation (i.e., the limit of our ability to measure line displacement in our system). The absence of line displacement is again consistent with effective charge dissipation during patterning by the Cu/SAM underlayer.

Example 7

This example illustrates, via FIG. 11, the improvement in pattern placement and subfield stitching in e-beam lithography by the inclusion of a Cu-EDA layer. The pattern written consisted of a 1 $\mu$m period grating of single pass lines, exposed with a dose of 2 nC/cm. In FIG. 11(a) the sample consisted of 100 nm of UVII resist (Shipley Corp.) on glass. In FIG. 11(b) the sample was 100 nm of UVII resist (Shipley Corp.) coating a 15 nm Cu/EDA layer on patterned Cr on glass. The Cr pattern was isolated in a region near the center of the glass and not electrically grounded except by contact to the 15 nm Cu layer. The patterns were written in a JEOL JBX-5DII operated at 50 kV. The JEOL writes the pattern with 80 $\mu$m fields between stage movements. Once the stage is stationary for a given field the JEOL writes the pattern in 10 $\mu$m square sub-fields within the 80 $\mu$m field. Shown in FIG. 11(a) is the interaction of the sub-fields due to charging. The charging causes deflections of the e-beam resulting in 0.1–0.4 $\mu$m placement errors in adjacent fields. In FIG. 11(b) the subfield stitching error is not observed. Thus the 15 nm thick Cu layer is a sufficient grounding layer to circumvent beam deflection due to charging and to reduce pattern placement error. A similar lack of observation of sub-field stitching error was found on samples in which the Cu layer was deposited on top of the resist (as described in FIG. 2(c) and FIGS. 5 and 6). Following resist exposure and a post exposure bake, we were able to remove the Cu using the HNO$_3$ wet-etch and develop the resist using standard procedures to complete the patterning process.

The above examples show that a 15 nm thick Cu/SAM layer is sufficient to eliminate charging effects under e-beam lithography conditions, while maintaining sufficient transparency to permit observation of alignment marks and underlying topographies for efficient patterning. The metal/SAM layer is an efficient discharge layer when placed directly on a Cr on glass mask or on top of a resist (in a resist bilayer scheme). With regard to the latter, the Cu/SAM film can be deposited on top of a resist without materially affecting its exposure properties or normal processing. It can be deduced from the above examples that a 15 nm layer of Cu/SAM on a substrate surface or on the top surface of a resist coating a substrate can function as an effective discharge layer in e-beam lithography.

What is claimed is:

1. An anti-charging layer for charged particle beam lithography comprising:
    a substrate;
    a ligand self-assembled monolayer (SAM) bound to said substrate;
    a Pd catalyst bound to said ligand SAM;
    an electroless metal layer deposited on said Pd catalyst in order to create an anti-charging layer, said metal layer being continuous and conductive in order to permit charge dissipation, said metal layer being further transparent in the visible region; and
    an imaging resist covering said anti-charging layer.
2. The anti-charging layer as in claim 1, wherein said substrate is unpatterned.
3. The anti-charging layer as in claim 1, wherein said substrate is patterned.
4. The anti-charging layer as in claim 1, further comprising:
    a coating on said substrate wherein said coating is comprised of a polymer planarizer layer bearing OH surface groups.
5. The anti-charging layer as in claim 1, further comprising:
    a coating on said substrate wherein said coating is comprised of a polymer planarizer layer not bearing OH surface groups, wherein said OH groups are created by oxygen plasma etch of said substrate prior to binding said ligand SAM to planarizer.

6. The anti-charging layer as in claim 1, wherein said ligand is organosilane.

7. The anti-charging layer as in claim 1, wherein said ligand is chemisorbed to said substrate.

8. The anti-charging layer as in claim 1, wherein said Pd catalyst is a Pd/Sn colloid.

9. The anti-charging layer as in claim 1, wherein said Pd catalyst is covalently or non covalently bound to said ligand SAM.

10. The anti-charging layer as in claim 1, wherein said metal comprises electroless copper.

11. The anti-charging layer as in claim 1, wherein said electroless metal is deposited over the entire substrate in order to provide an electrically conductive and transparent metal film.

12. The anti-charging layer as in claim 1, wherein said metal layer has a thickness between about 15–40 nm.

13. The anti-charging layer as in claim 1, wherein said imaging resist is a thin polymer film sensitive to charged particle beam exposure.

14. The anti-charging layer as in claim 1, wherein said imaging resist is an imaging SAM sensitive to charged particle beam exposure.

15. An anti-charging layer for charged particle beam lithography comprising:
    a substrate;
    an imaging resist bound to said substrate;
    a ligand bound to said imaging resist;
    a Pd catalyst bound to said ligand; and
    an electroless metal layer deposited on said Pd catalyst in order to create the anti-charge layer, said metal layer being continuous and conductive in order to permit charge dissipation, said metal layer being further transparent in the visible region.

16. The anti-charging layer as in claim 15, wherein said substrate is patterned.

17. The anti-charging layer as in claim 15, wherein said substrate is unpatterned.

18. The anti-charging layer as in claim 15, wherein said substrate is coated with a polymer planarizer layer bearing OH surface groups.

19. The anti-charging layer as in claim 15, wherein said substrate is coated
    by a polymer planarizer layer not bearing OH surface groups, wherein
    said OH groups are created by oxygen plasma etch of said substrate prior
    to binding said ligand SAM to the planarizer.

20. The anti-charging layer as in claim 15, wherein said imaging resist is a thin polymer film sensitive to charged particle beam exposure.

21. The anti-charging layer as in claim 15, wherein said ligand is a ligand SAM chemisorbed onto the surface of said imaging resist.

22. The anti-charging layer as in claim 15, wherein said ligand is a molecular species physisorbed onto the surface of said imaging resist.

23. The anti-charging layer as in claim 15, wherein said ligand comprises species capable of binding metal.

24. The anti-charging layer as in claim 15, wherein said Pd catalyst is a Pd/Sn colloid.

25. The anti-charging layer as in claim 24, wherein said Pd catalyst is covalently or non-covalently bonded to the physisorbed ligand on the imaging resist surface.

26. The anti-charging layer as in claim 15, wherein said metal is electroless copper.

27. The anti-charging layer as in claim 15, wherein said electroless metal is deposited over the entire substrate in order to provide an electrically conductive and transparent metal film.

28. The anti-charging layer as in claim 15, wherein said metal layer has a thickness between about 15–40 nm.

29. An anti-charging layer for charged-particle beam lithography comprising:
    a first ligand layer bound to a substrate;
    a first catalyst bound to said first ligand layer;
    an electroless metal anticharging layer attached to said catalyst, said metal anticharging layer being continuous and conductive in order to permit charge dissipation, said metal anticharging layer being further transparent in the visible region;
    a polymer imaging resist layer attached to said anticharging layer;
    a second ligand layer bound to said polymer imaging resist;
    a second catalyst bound to said second ligand layer; and
    an electroless metal anticharging layer bound to said second catalyst.

30. The anti-charging layer as in claim 29, wherein said substrate is patterned.

31. The anti-charging layer as in claim 29, wherein said substrate is unpatterned.

32. The anti-charging layer as in claim 29, wherein said substrate is coated by a polymer planarizer layer.

33. The anti-charging layer as in claim 29, wherein said polymer imaging resist is a thin polymer film sensitive to charged particle beam exposure.

34. The anti-charging layer as in claim 29, wherein said first ligand is a ligand SAM chemisorbed onto the surface of said substrate.

35. The anti-charging layer as in claim 29, wherein said first ligand is a molecular species physisorbed onto the surface of said substrate.

36. The anti-charging layer as in claim 29, wherein said catalyst is a Pd/Sn colloid.

37. The anti-charging layer as in claim 29, wherein said catalyst is covalently or non-covalently bonded to the physisorbed surface.

38. The anti-charging layer as in claim 29, wherein said metal is electroless copper.

39. The anti-charging layer as in claim 29, wherein said electroless metal is deposited over the entire substrate in order to provide an electrically conductive and transparent metal film.

40. The anti-charging layer as in claim 29, wherein said metal layer has a thickness between about 15–40 nm.

* * * * *